United States Patent
Simsek-Ege et al.

(10) Patent No.: US 11,690,216 B2
(45) Date of Patent: Jun. 27, 2023

(54) STRUCTURE TO REDUCE BENDING IN SEMICONDUCTOR DEVICES

(71) Applicant: Micron Technology, Inc., Boise, ID (US)

(72) Inventors: Fatma Arzum Simsek-Ege, Boise, ID (US); Clement Jacob, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/713,913

(22) Filed: Dec. 13, 2019

(65) Prior Publication Data
US 2021/0183866 A1 Jun. 17, 2021

(51) Int. Cl.
| H01L 21/768 | (2006.01) |
| H01L 23/522 | (2006.01) |
| H01L 23/00 | (2006.01) |
| H01L 23/31 | (2006.01) |
| H01L 23/495 | (2006.01) |
| H01L 23/528 | (2006.01) |
| H01L 23/532 | (2006.01) |
| H10B 12/00 | (2023.01) |

(52) U.S. Cl.
CPC ........... *H10B 12/34* (2023.02); *H10B 12/053* (2023.02); *H10B 12/488* (2023.02); *H10B 12/31* (2023.02)

(58) Field of Classification Search
CPC ......... H01L 27/10823; H01L 27/10876; H01L 27/10891; H01L 27/10808
See application file for complete search history.

(56) References Cited

U.S. PATENT DOCUMENTS

| 7,662,693 | B2 | 2/2010 | Bhattacharyya |
| 7,875,529 | B2 | 1/2011 | Forbes et al. |
| 8,274,777 | B2 | 9/2012 | Kiehlbauch |
| 8,647,972 | B1* | 2/2014 | Ando ................ H01L 29/66795 |
| | | | 257/E21.294 |
| 2004/0253807 | A1* | 12/2004 | Thei .................. H01L 21/76849 |
| | | | 257/E21.585 |
| 2007/0210350 | A1* | 9/2007 | Omura ................ H01L 23/4824 |
| | | | 257/E21.384 |

(Continued)

OTHER PUBLICATIONS

Straten et al., ALD and PVD Tantalum Nitride Barrier Resistivity and Their Significance in via Resistance Trends, 2014 ECS Trans. 64 117 (Year: 2014).*

*Primary Examiner* — Marcos D. Pizarro
*Assistant Examiner* — Tenley H Schofield
(74) *Attorney, Agent, or Firm* — Brooks, Cameron & Huebsch, PLLC

(57) ABSTRACT

An example apparatus includes a first source/drain region and a second source/drain region formed in a substrate. The first source/drain region and the second source/drain region are separated by the channel. The example apparatus further includes a gate separated from the channel by a dielectric material and an access line formed in a high aspect ratio trench connected to the gate. The access line includes a first titanium nitride (TiN) material formed in the trench, a metal material formed over the first TiN material, and a second TiN material formed over the metal material. The example apparatus further includes a sense line coupled to the first source/drain region and a storage node coupled to the second source/drain region.

9 Claims, 8 Drawing Sheets

(56) References Cited

U.S. PATENT DOCUMENTS

| | | | |
|---|---|---|---|
| 2008/0105983 A1* | 5/2008 | Jeong | H01L 21/76856 257/E21.171 |
| 2008/0116576 A1* | 5/2008 | Moon | H01L 23/53238 257/E23.161 |
| 2009/0114966 A1* | 5/2009 | Renn | H01L 27/10876 257/E29.345 |
| 2010/0221876 A1* | 9/2010 | Kim | H01L 27/1203 257/E21.616 |
| 2013/0049072 A1* | 2/2013 | Heineck | H01L 29/66621 438/587 |
| 2013/0161734 A1* | 6/2013 | Wu | H01L 29/4236 257/330 |
| 2014/0284717 A1* | 9/2014 | Standaert | H01L 23/367 438/157 |
| 2015/0021694 A1* | 1/2015 | Trevino | H01L 27/092 438/589 |
| 2015/0024584 A1* | 1/2015 | Wells | H01L 29/66795 438/589 |
| 2015/0214313 A1* | 7/2015 | Oh | H01L 29/4236 257/2 |
| 2018/0174845 A1* | 6/2018 | Jang | H01L 21/28088 |
| 2019/0157102 A1* | 5/2019 | Jian | C23C 16/56 |
| 2019/0355619 A1* | 11/2019 | Chan | H01L 21/76897 |
| 2020/0176451 A1* | 6/2020 | Kang | H01L 27/10823 |
| 2020/0395455 A1* | 12/2020 | Kim | H01L 29/4236 |

* cited by examiner

STRUCTURE TO REDUCE BENDING IN SEMICONDUCTOR DEVICES

TECHNICAL FIELD

The present disclosure relates generally to semiconductor devices and methods, and more particularly to semiconductor structure formation.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1:
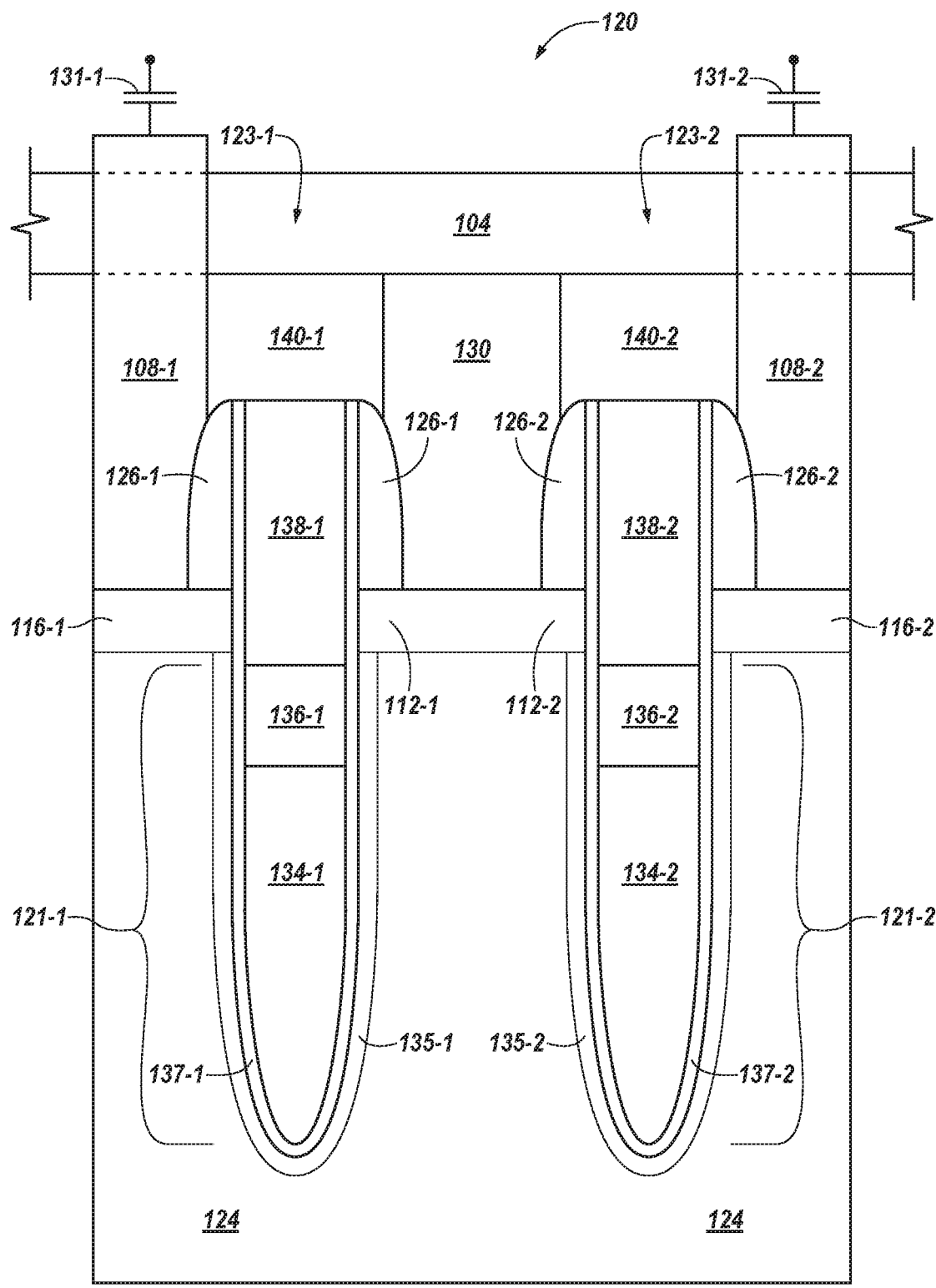
FIG. 1 illustrates an example cross-sectional view of a memory cell in accordance with a number of embodiments of the present disclosure.

Various types of memory devices, including arrays of volatile and/or non-volatile memory cells (e.g., a memory array) are disclosed, where a dielectric material used to reduce line bending in semiconductor structures. For example, according to a particular design rule, metal material may be deposited in a high aspect ratio trench, e.g., 20:1-50:1 or greater. In one example, a trench may be formed in a substrate to a depth of approximately 1,000 Angstroms (Å) or greater having a width of 50 Å or less. When a metal material fills the trenches in the substrate, semiconductor structures (e.g., access lines to memory cells) may bend as they are being formed. With shrinking design rules and increased aspect ratios, access line bending may become more difficult to prevent in memory array formation and cause damage to memory arrays. A process to reduce (e.g., eliminate) access line bending is beneficial. Access line bending may decrease the performance of the memory device in which the access line is formed. Reducing access line bending may help counteract the decreased performance. Example embodiments herein disclose a process for forming semiconductor structures without causing an access line to bend.

In some embodiments, the dielectric material used to fill the trenches is a nitride (N). In some embodiments, the nitride may be titanium nitride (TiN) or titanium silicon nitride (TiSiN). In some embodiments the TiN may be Ti(x)N(y), wherein "x" is approximately 0.05 and "y" is in a range of approximately 0.05-1. In some embodiments, the metal material used to fill the trench may be ruthenium (Ru) or other noble metals, molybdenum (Mo), or cobalt (Co). While examples in the present disclosure discuss filling the trenches with a nitride, embodiments are not so limited and may include other dielectric materials.

The nitride and metal materials may be deposited in trenches formed in a memory device. In some embodiments, the memory device may be a DRAM memory device. As stated above, shrinking design rules and increased line bending may cause access line bending reduction to be more difficult. Reducing access line bending may become even more difficult at critical dimensions less than or equal to 150 Å. At these critical dimensions, apparatuses and methods for reducing access line bending may be even more beneficial.

Forming a semiconductor structure without causing access line bending may involve depositing a layer of nitride material into a trench. A metal material may be deposited on the layer of nitride material and a second nitride material may be deposited on the metal material. In some embodiments, the first and second nitride materials may be the same nitride material. In some embodiments, the nitride material may be different nitride materials. The nitride materials may function as scaffolding to brace the trench. As used herein, the term "scaffolding" may refer to a semiconductor element that is used to provide support for a semiconductor structure. This may reduce access line bending during semiconductor structure formation.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something may refer to one or more such things. For example, a number of pillars lines may refer to at least one pillar.

The figures herein follow a numbering convention in which the first digit or digits correspond to the figure number of the drawing and the remaining digits identify an element or component in the drawing. Similar elements or components between different figures may be identified by the use of similar digits. For example, reference numeral 124 may reference element "24" in FIG. 1, and a similar element may be referenced as 224 in FIG. 2. Multiple analogous elements within one figure may be referenced with a reference numeral followed by a hyphen and another numeral or a letter. For example, 116-1 may reference element 16-1 in FIGS. 1 and 116-2 may reference element 16-2, which may be analogous to element 116-1. Such analogous elements may be generally referenced without the hyphen and extra numeral or letter. For example, elements 116-1 and 116-2 or other analogous elements may be generally referenced as 116.

FIG. 1 illustrates a cross-sectional view of an apparatus 120 showing a pair of neighboring memory cells sharing a source/drain region (e.g., 112-1 and 112-2) and a sense line contact 130 connecting to a passing sense line 104. The pair of neighboring memory cells include access devices 123-1, 123-2 (individually or collectively referred to as access devices 123) coupled to storage node contacts 108-1, 108-2 (individually or collectively referred to as storage node contacts 108) and storage nodes 131-1, 131-2 (individually or collectively referred to as storage nodes 131) in accordance with a number of embodiments of the present disclosure.

The access devices 123 include gates 121-1, 121-2 (individually or collectively referred to as gate 121). The gate 121 may also be referred to as a gate electrode. The access devices 123 may include a recessed access device (e.g., a buried recessed access device (BRAD)). In the example shown, the gate 121 may include a first portion 134-1, 134-2 (individually or collectively referred to as first portion 134) including a metal containing material (e.g., titanium nitride (TiN)), and a second portion 136-1, 136-2 (individually or collectively referred to as second portion 136) including a doped polysilicon to form a hybrid metal gate (HMG) 121. The gate 121 may be separated from a channel 135-1, 135-2 (individually or collectively referred to as channel 135) by a gate dielectric 137-1, 137-2 (individually or collectively referred to as gate dielectric 137). The gate 121 separates a first source/drain region 116-1, 116-2 (collectively or individually referred to as first source/drain region 116) and a second source/drain region 112-1, 112-2 (individually or collectively referred to as second source/drain region 112). In the example of FIG. 1, two neighboring access devices 123 are shown sharing a second source/drain region 112 at a junction. The neighboring access devices 123 may be formed on a working surface of a semiconductor material on a substrate 124.

In the example of FIG. 1, a storage node 131 (shown schematically for ease of illustration) is connected to a storage node contact 108 formed in accordance with techniques familiar to persons skilled in the art. The storage node contact 108 may be connected to an active area (e.g., a first source/drain region 116 of an access device 123). An insulation material (e.g., a dielectric material) 140-1, 140-2 (individually or collectively referred to as insulation material 140) may be formed on the spacer material 126-1, 126-2 (individually or collectively referred to as spacer material 126) and the gate mask material 138-1, 138-2 (individually or collectively referred to as gate mask material 138), and in contact with a conductive material 130 serving as a sense line contact 130. The sense line contact 130 may be connected to a sense line 104 (e.g., passing sense line orthogonal to a directional orientation of access lines connecting to gates 121 of the access devices 123). In the example illustration of FIG. 1, the illustrated passing sense line 104 is actually recessed into the page, parallel to the plane of the drawing sheet so as to be offset a particular depth from the storage nodes 131. Access lines connected to gates 121 may be running perpendicular to a plane of the drawing sheet, e.g., coming out of the page.

In some embodiments the sense line contact 130 may be a metallic material (e.g., Tungsten (W)). The insulation material 140 may be formed on the spacer material 126 and the gate mask material 138, and in contact with the conductive sense line material 130. Embodiments, however, are not limited to this example. According to some embodiments, the memory cells may include nitride material and metal material filling a trench to form access lines, e.g., shown in more detail in FIGS. 2A-3B, to gates of the neighboring access devices 123 during semiconductor structure formation such that access line bending is reduced in accordance with the techniques described herein.

Figure 2A:
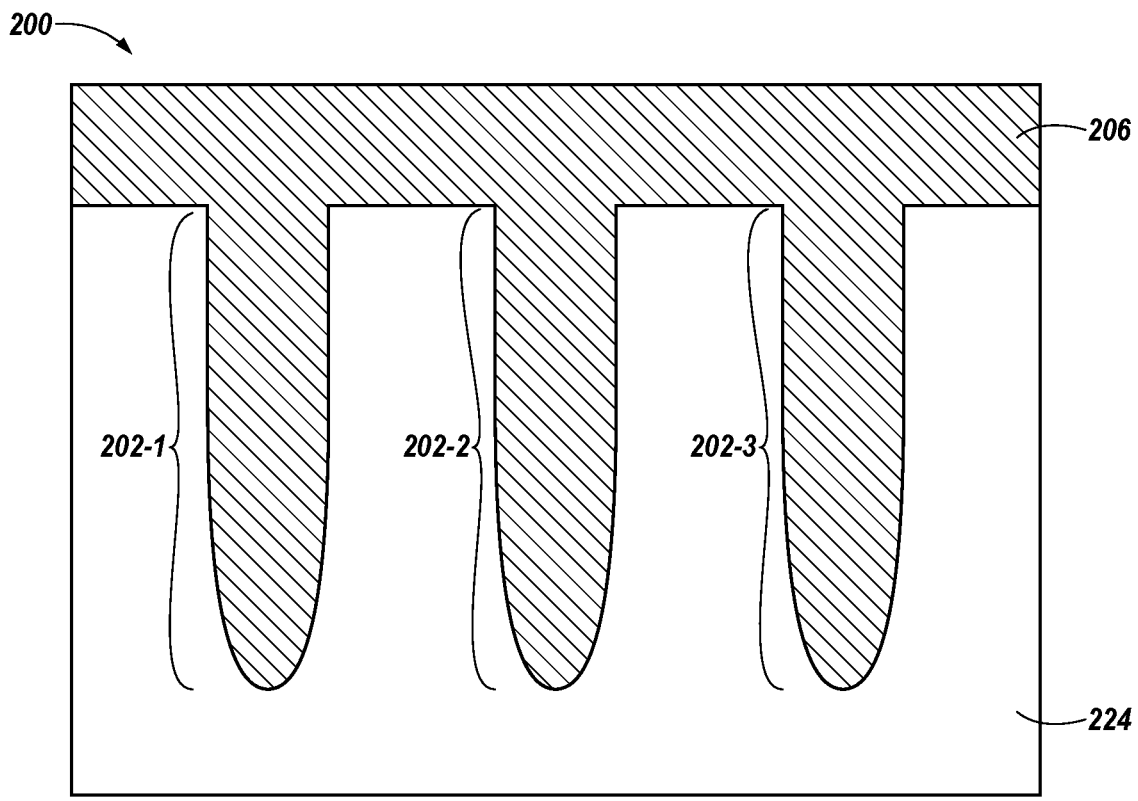
FIGS. 2A-2B illustrate example cross-sectional views of semiconductor material deposition which may occur in semiconductor structure formation.
Figure 2B:
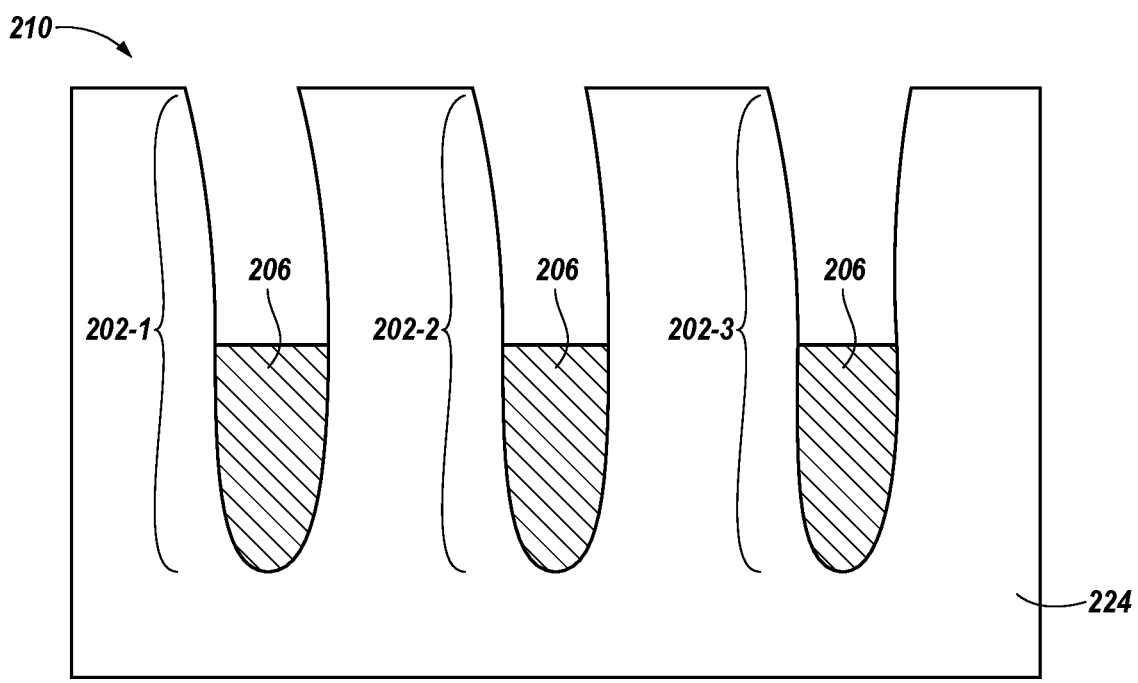

FIGS. 2A-2B illustrate example cross-sectional views of a semiconductor material deposition which may occur in semiconductor structure formation. The process of FIGS. 2A-2B illustrates a previous approach to access line formation than the implementation described in the present disclosure.

FIG. 2A illustrates a semiconductor material 206 deposition which may occur in a semiconductor structure at a point in time 200 in a semiconductor fabrication process. In some embodiments, the semiconductor material 206 may be TiN. The trenches 202-1, 202-2, 202-3 (individually and collectively referred to as trenches 202) may be formed in a working surface of a substrate material 224. The trenches 202 may be filled with a semiconductor material 206. The semiconductor material 206 may completely fill the trench 202 and be deposited over the top of the working surface of the substrate material 224.

At certain critical dimensions, the process shown in FIG. 2A may result in decreased performance of the apparatus in which the trenches 202 are formed. For example, at critical dimensions less than or equal to 150 Å, the resistivity and capacitance of the semiconductor material 206 may be high and decrease the conductivity of the access line formed in the trench 202. At higher critical dimensions, the semiconductor material 206 may not decrease the conductivity of the access formed line in the trench 202 in a manner that decreases the performance of the memory device in which the trenches are formed.

FIG. 2B illustrates an etching of a semiconductor material 206 which may occur in a semiconductor structure at a point in time 210 in a semiconductor fabrication process. A portion of the semiconductor material 206 may be etched down in the trench 202.

Figure 3A:
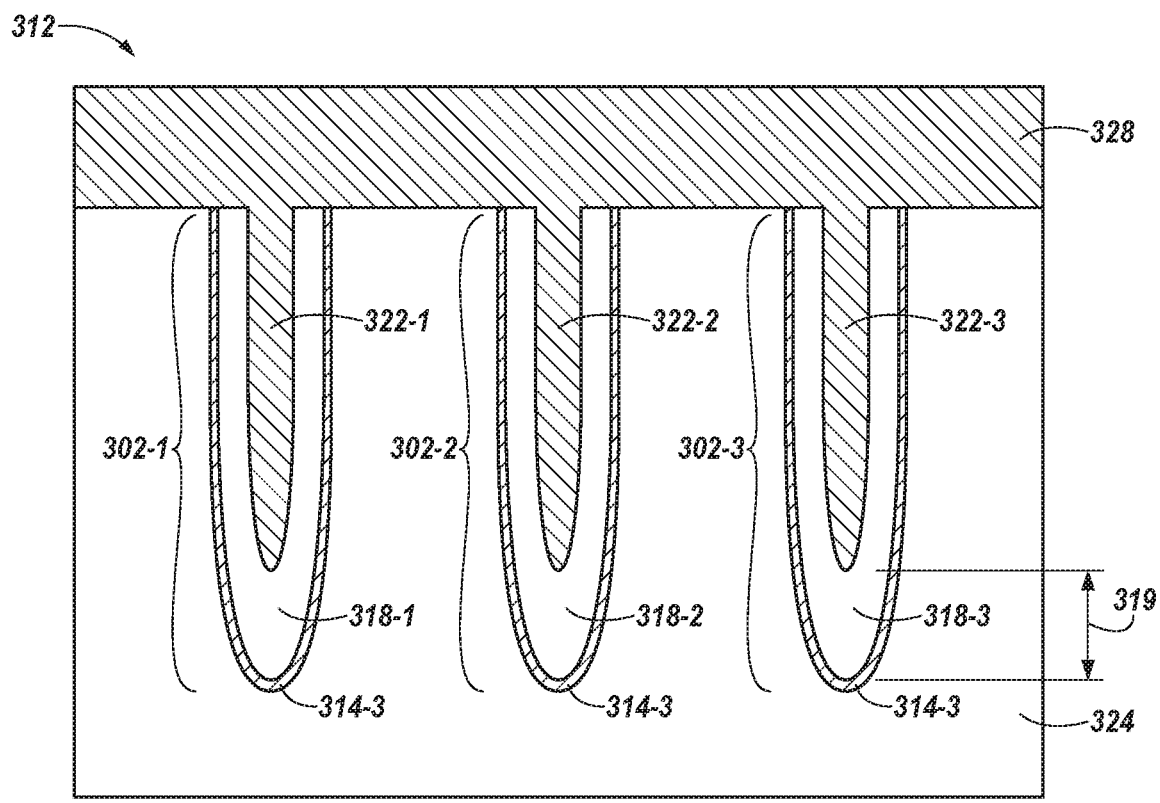
FIGS. 3A-3B illustrate example cross-sectional views of semiconductor structure formation in accordance with a number of embodiments of the present disclosure.
Figure 3B:
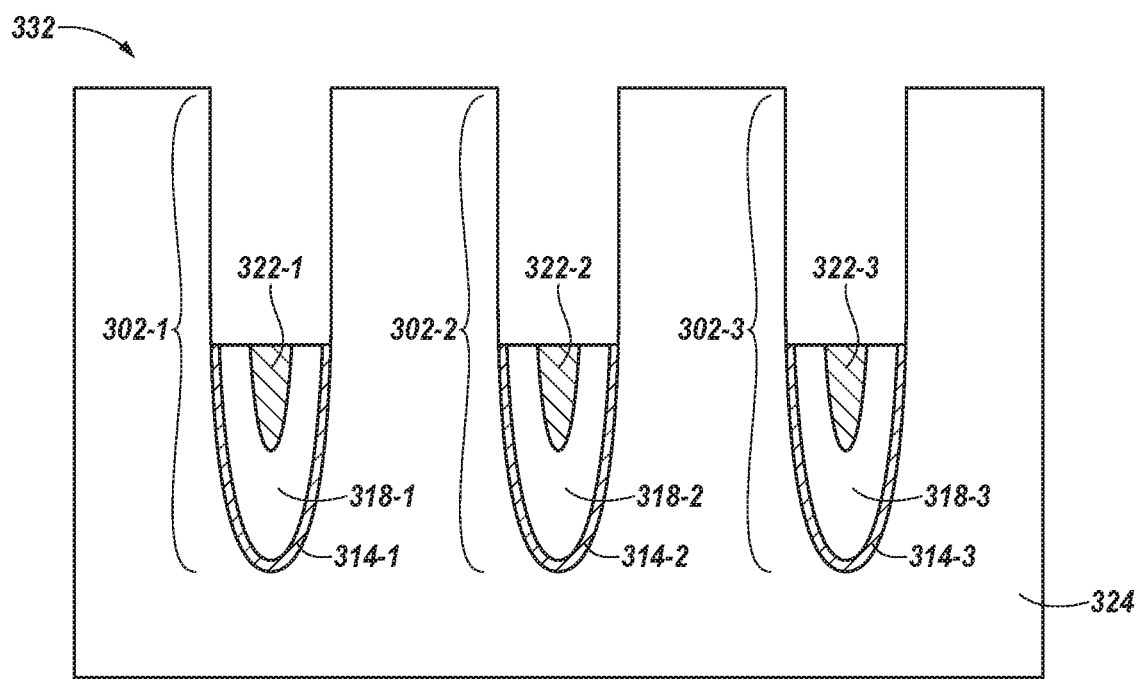

FIGS. 3A-3B illustrate example cross-sectional views of semiconductor structure formation in accordance with a number of embodiments of the present disclosure. The process resulting in a reduction of access line bending, illustrated in FIGS. 3A-3B is shown at particular points in time that correspond to particular processing activities being performed in a semiconductor structure formation process. Other processing activities included in a particular semiconductor fabrication sequence may be omitted for ease of illustration.

FIG. 3A illustrates a semiconductor material deposition and a metal material deposition that reduces access line bending in a semiconductor structure at a point in time 312. In some embodiments, the semiconductor material may be nitride material. Trenches 302-1, 302-2, 302-3 (individually or collectively referred to as trenches 302) may be formed in a semiconductor working surface on a substrate material 324 using known photolithographic masking and etching techniques, etc. The trenches 302 may be formed to a depth in a range of 1,000-1,500 Å. In some embodiments, the trenches 302 may be formed to a depth of 1,300 Å. The trenches 302 may be formed to a width in a range of 100-150 Å. In some embodiments, the trenches 302 may be formed to a width of 130 Å. The trenches 302 may have aspect ratios in a range of 8-12. In some embodiments, the aspect ratio of the trenches 302 may be 10.

The first nitride material 314-1, 314-2, 314-3 (individually or collectively referred to as nitride material 314) may be deposited into the trenches 302. In some embodiments, the nitride material 314 may be deposited to a thickness of 3-50 Å. A metal material 318-1, 318-2, 318-3 (individually or collectively referred to as metal material 318) may be deposited over the nitride material 314. For example, the metal material may be deposited using chemical vapor deposition (CVD) or other suitable technique. The metal material 318 may be formed to a height 319 in a range of 60-200 Å. In some embodiments, the metal material 318 may be formed to a height 319 of approximately 30% of the depth of the trench 302. In some embodiments, the apparatus in which the trenches 302 are formed, may have critical dimensions less than or equal to 100 Å.

A second nitride material 322-1, 322-2, 322-3 (individually or collectively referred to as second nitride material 322) may be deposited over the metal material 318 using CVD or other suitable processes. The second nitride material 322, along with the first nitride material 314, may act as a scaffolding for the trench 302 and reduce the bending of an access line formed from the trenches 302. The second nitride material 322 may continue to be deposited after the trench 302 has been filled. This may cause the second dielectric material 322 to be deposited over the top of trenches 302 and the surface of the substrate material 324. Continuing to deposit the second nitride material 322 after the trench 302 is full may result in a cap 328 being formed over the trenches 302 and the substrate material 324. In some embodiments, the cap 328 may be formed to a height in a range of 5-100 Å above the top of the filled trench 302 and the surface of the substrate material 324.

As stated above, the nitride materials 314 and 322 may act as scaffolding for the trenches 302. While forming certain semiconductor structures, it may be beneficial to fill the trenches 302 with metal materials 318 with a low resistivity. The low resistivity metal material 318 may provide better conductivity for the access lines. However, filling the trenches 302 with low resistivity metal materials 318 without additional support material may result in access line bending after the metal material 318 is deposited due to natural properties of the metal material 318, the critical dimensions of the trench 302, etc. To reduce access line bending, the nitride material 314, 322 may be deposited. The nitride material 314, 322 may add support to the trenches 302 and reduce access line bending in the trenches 302 after the trenches 302 are filled. In some embodiments, the nitride material may be TiN. In some embodiments, the nitride material may be TiSiN. In some embodiments, TiSiN may provide more support for the trenches 302 than TiN.

FIG. 3B illustrates an etching of semiconductor materials and a metal material that reduces access line bending in a semiconductor structure at a point in time 332. In some embodiments, the semiconductor materials may be nitride materials. As shown in FIG. 3B, the first nitride material 314, the metal material 318, and the second nitride material 322 have been etched down in the trenches 302. In some embodiments, the etch performed in the trench may be a dry etch. A dry etch may be preferred over a wet etch to reduce the sputtering that may occur when using a wet etch. As used herein, the term "sputtering" may refer to the ejection of semiconductor material from a source semiconductor material. The sputtering of etchant that may result from using a wet etch may cause etchant to be deposited in unintended areas. Therefore, using a dry etch that reduces sputtering may be beneficial.

Filling the trenches using a first nitride material 314, a metal material 318, and a second nitride material 322 may also provide cost benefits. The metal material 322 may be more expensive than the first nitride material 314 and the second nitride material 322. Filling the trench 302 with a metal material 318, without also filling the trench 302 with the first nitride material 314 and the second nitride material 322, may result in more of the metal material 322 being etched from the trenches 302. Since the metal material 318 may be more expensive than the first nitride material 314 and the second nitride material 322, this may result in more money being lost in the etching process than if the trench was filled with a mix of nitride materials and metal materials as described herein.

Figure 4:
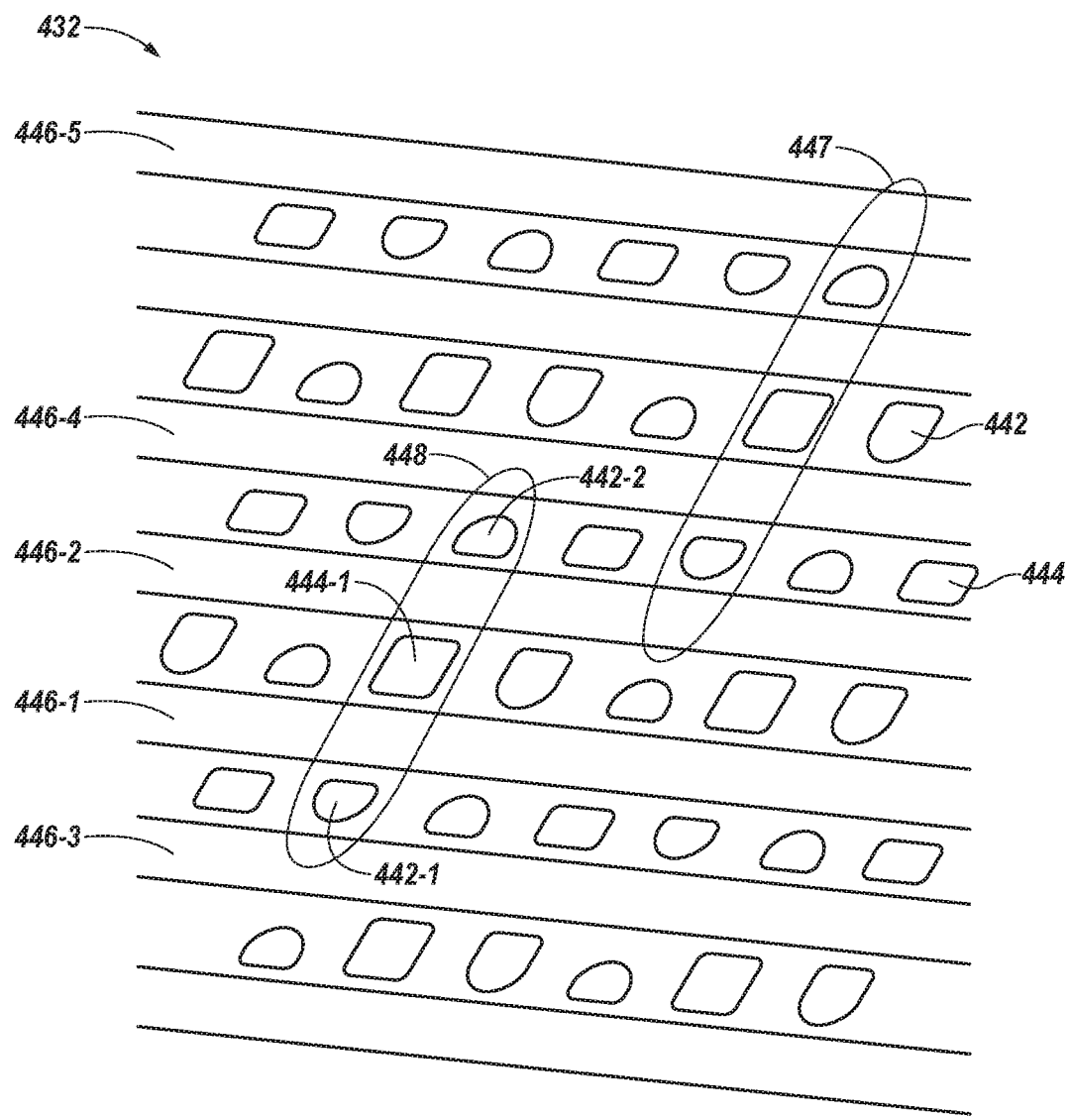
FIG. 4 illustrates an example top-down view of a memory array structure in accordance with a number of embodiments of the present disclosure.

FIG. 4 illustrates an example of a top-down view of a memory array structure 432 in accordance with a number of embodiments of the present disclosure. FIG. 4 illustrates a number of active area regions, e.g. 447 and 448, first source/drain regions 442, and second source/drain regions 444, as shown in FIG. 1. Active area region 448 encompasses a pair of access devices sharing a second source/drain region 444-1 that can be connected to a sense line and a pair of first source/drain regions 442-1 and 442-2 (individually or collectively referred to as first source/drain region 442), as shown in FIG. 1. The second source/drain region 444-1 and the first source/drain region 442-1 may be separated by a channel and an access line 446-1. Adjacent the example active areas 447 and 448 on either side can be located a number of passing access lines 446-3 and 446-4 to other active areas.

In the example of FIG. 4, active area region 447 encompasses an active area of neighboring access devices and neighboring, passing access lines 446-2 and 446-5. The passing access lines 446-1, 446-2, 446-3, 446-4, 446-5 (individually or collectively referred to as passing access lines 446) may be formed in trenches (e.g., trenches 302 in FIGS. 3A and 3B). These trenches may be filled with nitride materials (e.g., a first nitride material 314 and a second nitride material 322 shown in FIGS. 3A and 3B) and a conductive material (e.g., a metal material 318 shown in FIGS. 3A and 3B) in accordance with embodiments of the present disclosure.

Active area region 448 illustrates a pair of access devices sharing a source/drain region 444-1. A damascene sense line (not pictured) may be coupled to a second source/drain region 444-1, analogous to sense line 104 shown in FIG. 1, perpendicular to passing access lines 446. As used herein, the term "damascene sense line" may refer to a sense line that is formed in trenches that are formed in a dielectric material. Similar to the access lines described herein, at certain aspect ratios (e.g., aspect ratios between 8-12), damascene sense lines may experience bending after certain semiconductor processes. The techniques described herein to reduce access line bending may also be used in damascene sense line structures to reduce damascene sense line bending. Embodiments are intended to cover the same.

Semiconductor structures formed according to the top-down view of an example memory array layout may include memory cells, e.g., access devices and storage nodes (such as transistors and capacitor cells, etc.). A DRAM array is one example memory array that can be formed from semiconductor structures fabricated through a semiconductor fabrication process performed on a substrate of a semiconductor wafer. A memory array may have an of array of access devices and storage nodes forming memory cells at an intersection of sense lines and access lines.

Figure 5:
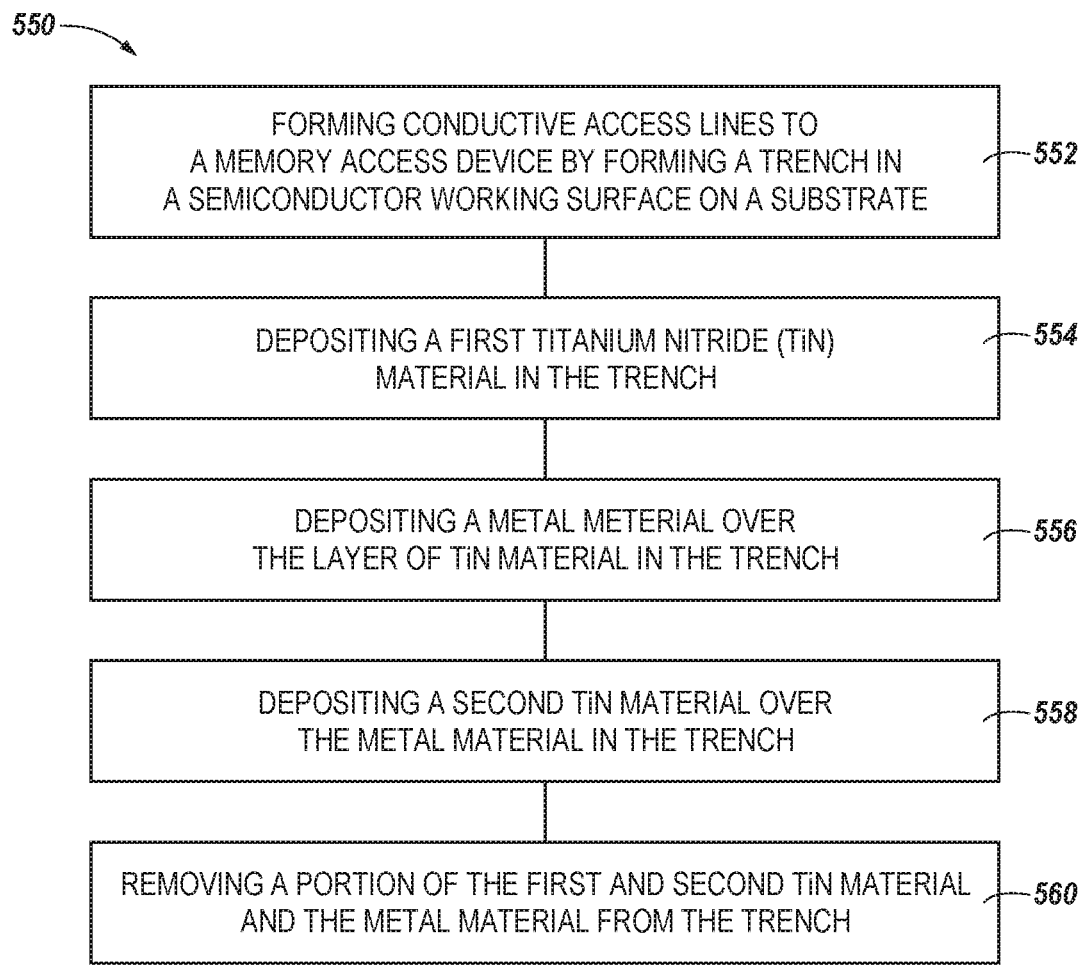
FIG. 5 is a flow diagram of an example method for semiconductor structure formation in accordance with a number of embodiments of the present disclosure.

FIG. 5 is a flow diagram of an example method for semiconductor structure formation in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 552, the method 550 may include forming conductive access lines to a memory access device by forming a trench in a semiconductor working surface on a substrate. The trench may be formed to a depth in a range of 1,000-1500 Å. In some embodiments, the trench may be formed to a depth of 1,300 Å. The trench may be formed to a width in a range of 100-150 Å. In some embodiments, the trench may be formed to a width of 130 Å. The trench may have an aspect ratio in a range of 8-12. In some embodiments, the trench may have an aspect ratio of 10.

At block 554, the method 550 may include depositing a first TiN material in the trench. By way of example, and not by way of limitation, the first TiN may be deposited using CVD. The first TiN material may be deposited at a temperature in a range of approximately 400-600 degrees Celsius (° C.). In some embodiments, the first TiN material may be deposited at 600° C. In some embodiments, a first TiSiN material may be deposited instead of the first TiN material. In this example, this first TiSiN material may be deposited at a temperature in a range of approximately 400° C. The first nitride material (e.g., the first TiN material or the first TiSiN material) may be deposited to a thickness in a range of 3-50 Å. Depositing the first nitride to a lesser thickness than a full width of the trench may allow room to deposit a subsequent conductive material while providing a support structure. For example, depositing the first nitride material to a lesser thickness may provide more space within the trench to subsequently deposit a conductive material and subsequently a second nitride material in the trench.

At block 556, the method 550 may include depositing a metal material over a layer of TiN material in the trench. The metal material may be formed out a noble metal material. The noble metal materials may include ruthenium (Ru), rhodium (Rh), palladium (Pd), silver (Ag), osmium (Os), iridium (Ir), platinum (Pt), and gold (Au). In some embodiments, the metal material may be formed out of Ru. In some embodiments, the metal material may be formed from a metal material that is not a noble metal material. For example, in some embodiments, the metal material may be formed out of molybdenum (Mo). In some embodiments, the metal material may be formed out of cobalt (Co).

At block 558, the method 550 may include depositing a second TiN material over the metal material. In some embodiments, the second TiN material may be the same material as the first TiN material. In some embodiments, the second TiN material may be a different material from the first TiN material. In some embodiments, the second TiN material may be TiSiN. In some embodiments, the TiSiN material may provide a brace for the trench than the TiN.

At block 560, the method 550 may include removing a portion of the first and second TiN and the metal material from the trench. The portion of the first and second TiN material may be removed using an etch. The first and second TiN material may reduce line bending of the trench after the etch.

Figure 6:
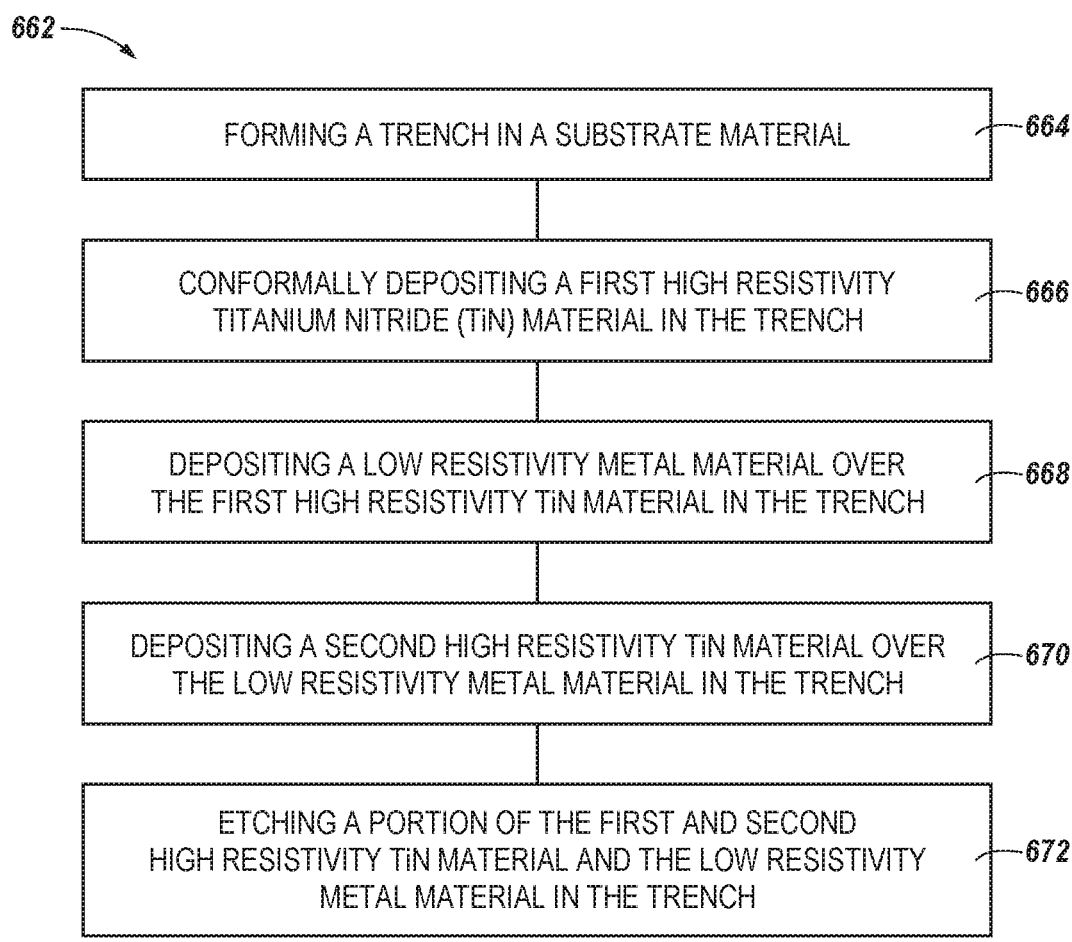
FIG. 6 is a flow diagram of another example method for semiconductor structure formation in accordance with a number of embodiments of the present disclosure.

FIG. 6 is a flow diagram of an example method for semiconductor structure formation in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 664, method 662 may include forming a trench in a substrate material. At block 666, The method 662 may include conformally depositing a first high resistivity TiN material in the trench. In some embodiments, the first high resistivity TiN material may have a resistivity greater than 10 ohm-meters ($\Omega$m). For example, the resistivity of the first TiN material may be approximately 13 $\Omega$m. The first high resistivity material may be conformally deposited using atomic layer deposition (ALD).

At block 668, method 662 may include depositing a low resistivity metal material over high resistivity TiN material in the trench. In some embodiments, the low resistivity metal material may be Ru, Mo, and/or Co. In some embodiments, the low resistivity metal material may have a resistivity less than 8 Sm. In some embodiments, the resistivity of Ru may be approximately 7.8 $\Omega$m. In some embodiments, the resistivity of Mo may be approximately 5.3 Sm. In some embodiments, the resistivity of Co may be approximately 6 $\Omega$m.

At block 670, the method 662 may include depositing a second high resistivity TiN material over the low resistivity metal material in the trench. In some embodiments, the second high resistivity TiN material may be the same material as the first high resistivity TiN material. In some embodiments, the second high resistivity may be a different material than the first high resistivity material.

At block 672, the method 662 may include etching a portion of the first and second high resistivity TiN material and the low resistivity metal material in the trench. In some embodiments, the portion of the first and second high resistivity material and the low resistivity metal material may be etched using a dry etch. A dry may be used to reduce sputtering of the etchant material. Sputtering may occur if a wet etch is used instead of a dry etch. In some embodiments, an additional high resistivity dielectric material may be deposited to fill a remaining portion of the trench after etching the high resistivity TiN material and the low resistivity metal material.

Figure 7:
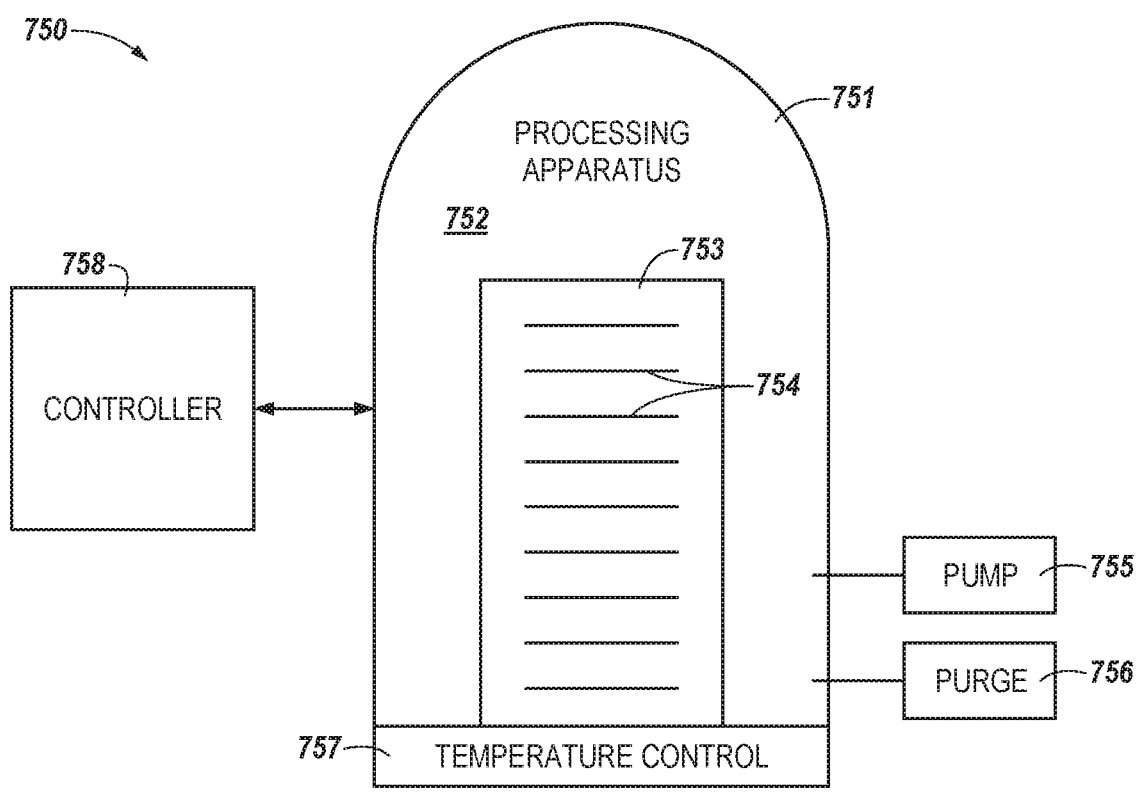
FIG. 7 is a functional block diagram of a system for implementation of an example semiconductor fabrication process in accordance with a number of embodiments of the present disclosure.

FIG. 7 is a functional block diagram of a system 750 for implementation of an example semiconductor fabrication process in accordance with a number of embodiments of the present disclosure. The numbering convention used in connection with FIG. 7 does not follow the earlier introduced numbering convention and sequence that applies to FIGS. 1-6. The system 750 may include a processing apparatus 751. The processing apparatus 751 may be configured to enable formation of structural materials on and/or removal of structural materials from a semiconductor device during fabrication of the semiconductor device.

FIG. 9 illustrates an example processing apparatus 751 that may be used in a semiconductor fabrication process. The processing apparatus 751 may include a chamber 752 to enclose components configured to perform deposition and/ or etch operations on a number of semiconductor devices. The chamber 752 may further enclose a carrier 753 to hold a batch of semiconductor wafers 754. The processing apparatus 751 may include and/or be associated with tools including, for example, a pump 755 unit and a purge 756 unit configured to introduce and remove appropriate etch chemistries, as described herein, at each point in the semiconductor fabrication sequence. The processing apparatus 751 may further include a temperature control 757 unit configured to maintain the chamber 752 at an appropriate temperature at each of the points in the fabrication sequence. The system 750 may include a number of chambers 752 that are each configured to perform particular processes (e.g., a wet etch process, a dry etch process, and/or a deposition process, among others) during the fabrication sequence.

The system 750 may further include a controller 758. The controller 758 may include, or be associated with, circuitry and/or programming for implementation of, for instance, semiconductor structure formation. Adjustment of such deposition, removal, and etching operations by the controller 758 may control the critical dimensions (CDs) of the semiconductor devices created in the processing apparatus 751.

A host may be configured to generate instructions related to semiconductor structure formation. The instructions may be sent via a host interface to the controller 758 of the processing apparatus 751. The instructions may be based at least in part on scaled preferences (e.g., in numerically and/or structurally defined gradients) stored by the host, provided via input from another storage system (not shown), and/or provided via input from a user (e.g., a human operator), among other possibilities. The controller 758 may be configured to enable input of the instructions and scaled preferences to define the CDs of the fabrication of the semiconductor device to be implemented by the processing apparatus 751.

The scaled preferences may determine final structures (e.g., the CDs) of neighboring semiconductor structures and access lines. Particular CDs may be enabled by the particular scaled preferences that are input via the instructions. Receipt and implementation of the scaled preferences by the controller 758 may result in corresponding adjustment, by the processing apparatus 751, of the characteristics of the semiconductor structure that is formed, among implementation of other possible scaled preferences.

The controller 758 may, in a number of embodiments, be configured to use hardware as control circuitry. Such control circuitry may, for example, be an application specific integrated circuit (ASIC) with logic to control fabrication steps, via associated deposition and etch processes, for semiconductor structure formation. The controller 758 may be configured to receive the instructions and direct performance of operations to perform the semiconductor structure formation methods as described in connection with FIGS. 3A-3B and 5-6.

Figure 8:
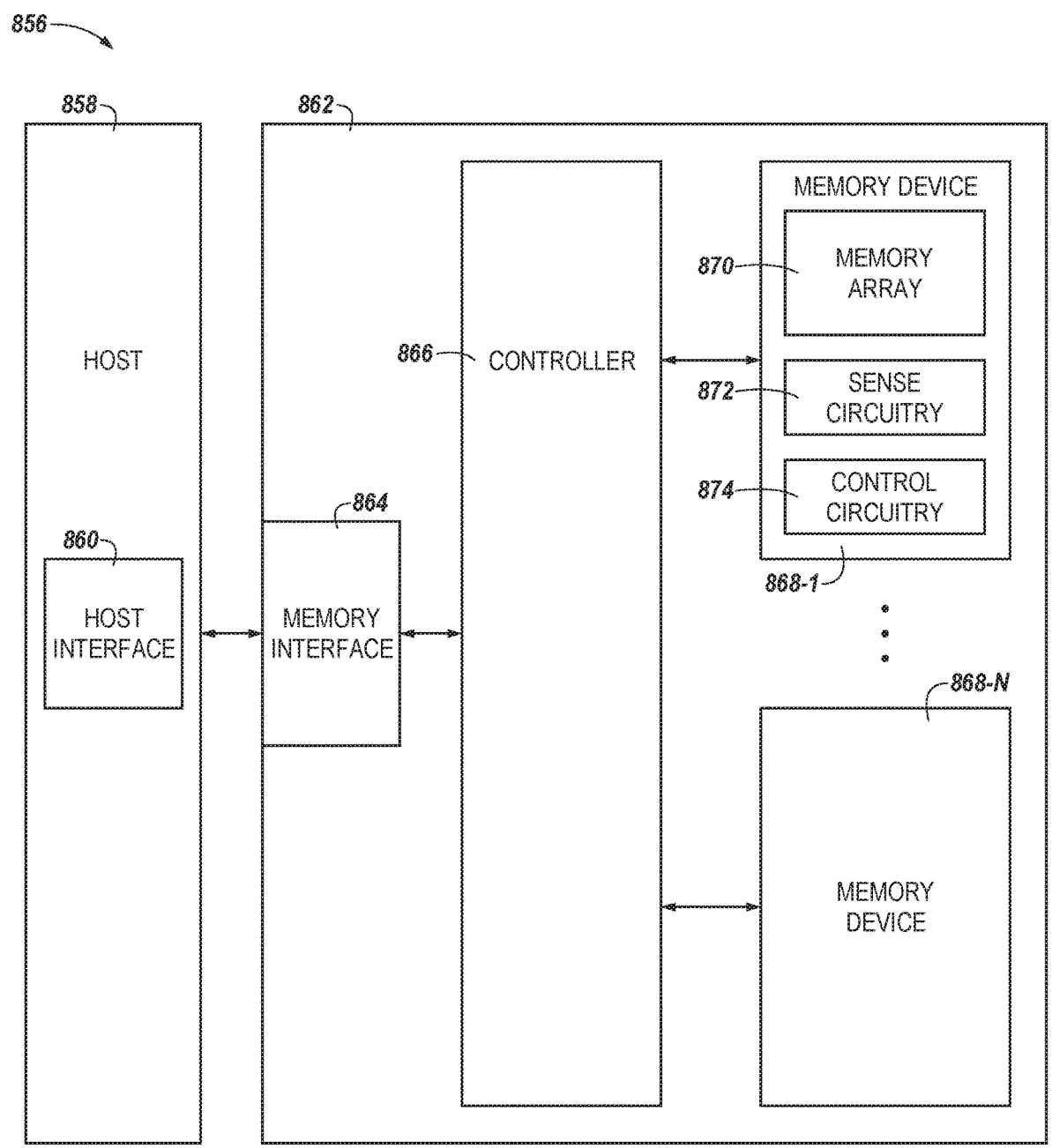
FIG. 8 is a functional block diagram of a computing system including at least one memory array having memory cells formed in accordance with a number of embodiments of the present disclosure.

FIG. 8 is a functional block diagram of a computing system 856 including at least one memory system 862 in accordance with one or more embodiments of the present disclosure. The numbering convention used in connection with FIG. 8 does not follow the earlier introduced numbering convention and sequence that applies to FIGS. 1-6. Memory system 862 may be, for example, a solid-state drive (SSD).

In the embodiment illustrated in FIG. 8, memory system 862 includes a memory interface 864, a number of memory devices 868-1, . . . , 868-N, and a controller 866 selectably coupled to the memory interface 864 and memory devices 868-1, . . . , 868-N. Memory interface 864 may be used to communicate information between memory system 862 and another device, such as a host 858. Host 858 may include a processor (not shown). As used herein, "a processor" may be a number of processors, such as a parallel processing system, a number of coprocessors, etc. Example hosts may include, or be implemented in, laptop computers, personal computers, digital cameras, digital recording devices and playback devices, mobile telephones, PDAs, memory card readers, interface hubs, and the like. Such a host 858 may be associated with fabrication operations performed on semiconductor devices and/or SSDs using, for example, a processing apparatus shown at 751 and described in connection with FIG. 7.

In a number of embodiments, host 858 may be associated with (e.g., include or be coupled to) a host interface 860. The host interface 860 may enable input of scaled preferences (e.g., in numerically and/or structurally defined gradients) to define, for example, critical dimensions (CDs) of a final structure or intermediary structures of a memory device (e.g., as shown at 868) and/or an array of memory cells (e.g., as shown at 870) formed thereon to be implemented by the processing apparatus 751. The array includes access devices having semiconductor structures, access lines, and dielectric material formed according to embodiments described herein. The scaled preferences may be provided to the host interface 860 via input of a number of preferences stored by the host 858, input of preferences from another storage system (not shown), and/or input of preferences by a user (e.g., a human operator).

Memory interface 864 may be in the form of a standardized physical interface. For example, when memory system 862 is used for information (e.g., data) storage in computing system 856, memory interface 864 may be a serial advanced technology attachment (SATA) interface, a peripheral component interconnect express (PCIe) interface, or a universal serial bus (USB) interface, among other physical connectors and/or interfaces. In general, however, memory interface 864 may provide an interface for passing control, address, information, scaled preferences, and/or other signals between the controller 866 of memory system 862 and a host 858 (e.g., via host interface 860).

Controller 866 may include, for example, firmware and/or control circuitry (e.g., hardware). Controller 866 may be operably coupled to and/or included on the same physical device (e.g., a die) as one or more of the memory devices 868-1, . . . , 868-N. For example, controller 866 may be, or may include, an ASIC as hardware operably coupled to circuitry (e.g., a printed circuit board) including memory interface 864 and memory devices 868-1, . . . , 868-N. Alternatively, controller 866 may be included on a separate physical device that is communicatively coupled to the physical device (e.g., the die) that includes one or more of the memory devices 868-1, . . . , 868-N.

Controller 866 may communicate with memory devices 868-1, . . . , 868-N to direct operations to sense (e.g., read), program (e.g., write), and/or erase information, among other functions and/or operations for management of memory cells. Controller 866 may have circuitry that may include a number of integrated circuits and/or discrete components. In a number of embodiments, the circuitry in controller 866 may include control circuitry for controlling access across memory devices 868-1, . . . , 868-N and/or circuitry for providing a translation layer between host 858 and memory system 862.

Memory devices 868-1, . . . , 868-N may include, for example, a number of memory arrays 870 (e.g., arrays of volatile and/or non-volatile memory cells). For instance, memory devices 868-1, ..., 868-N may include arrays of memory cells, such as a portion of an example memory device structured to include access lines on the sidewalls of semiconductor structures. At least one array includes an access device having a access lines on the sidewalls of semiconductor structures formed according to the embodiments disclosed herein. As will be appreciated, the memory cells in the memory arrays 870 of memory devices 868-1, ..., 868-N may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory device 868 may be formed on the same die. A memory device (e.g., memory device 868-1) may include one or more arrays 870 of memory cells formed on the die. A memory device may include sense circuitry 872 and control circuitry 874 associated with one or more arrays 870 formed on the die, or portions thereof. The sense circuitry 872 may be utilized to determine (sense) a particular data value (e.g., 0 or 1) that is stored at a particular memory cell in a row of an array 870. The control circuitry 874 may be utilized to direct the sense circuitry 872 to sense particular data values, in addition to directing storage, erasure, etc., of data values in response to a command from host 858 and/or host interface 860. The command may be sent directly to the control circuitry 874 via the memory interface 864 or to the control circuitry 874 via the controller 866.

The embodiment illustrated in FIG. 8 may include additional circuitry that is not illustrated so as not to obscure embodiments of the present disclosure. For example, memory device 868 may include address circuitry to latch address signals provided over I/O connectors through I/O circuitry. Address signals may be received and decoded by a row decoder and a column decoder to access a memory array 870. It will be appreciated that the number of address input connectors may depend on the density and/or architecture of memory devices 868 and/or memory arrays 870.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example embodiments including various combinations and configurations of semiconductor materials, underlying materials, structural materials, dielectric materials, capacitor materials, substrate materials, silicate materials, oxide materials, nitride materials, buffer materials, etch chemistries, etch processes, solvents, memory devices, memory cells, openings, among other materials and/or components related to semiconductor structure formation, have been illustrated and described herein, embodiments of the present disclosure are not limited to those combinations explicitly recited herein. Other combinations and configurations of the semiconductor materials, underlying materials, structural materials, dielectric materials, capacitor materials, substrate materials, silicate materials, oxide materials, nitride materials, buffer materials, etch chemistries, etch processes, solvents, memory devices, memory cells, sidewalls of openings and/or trenches related to semiconductor structure formation than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a first source/drain region and a second source/drain region formed in a substrate, wherein the first source/drain region and the second source/drain region are separated by a channel;
   a gate separated from the channel by a dielectric material;
   an access line formed in a trench connected to the gate, wherein the access line includes:
   a first titanium nitride (TiN) material formed in the trench, wherein the first TiN is formed directly on the substrate;
   a metal material formed over the first TiN material; and
   a second TiN material formed over the metal material, wherein a top surface of the first TiN material, a top surface of the metal material, and a top surface of the second TiN material are formed to a same height relative to sidewalls of the trench;
a sense line coupled to the first source/drain region; and
a storage node coupled to the second source/drain region.

2. The apparatus of claim 1, wherein the first TiN material is formed to a thickness in a range of 3-50 Å (angstroms).

3. The apparatus of claim 1, wherein the metal material is formed to a height in a range of 60-200 Å.

4. The apparatus of claim 1, wherein the metal material is formed to a height that is 30% of a depth of the trench.

5. The apparatus of claim 1, wherein the trench is formed to a depth in a range of 1000-1500 Å.

6. The apparatus of claim 1, wherein the trench is formed to a width in a range of 100-150 Å.

7. The apparatus of claim 1, wherein the trench has an aspect ratio in a range of 8-12.

8. The apparatus of claim 1, wherein a width of the trench is less than or equal to 50 Å.

9. A method, comprising:
forming a first source/drain region and a second source/drain region formed in a substrate material;
forming a trench in the substrate material;
forming a channel that separates the first source/drain region and the second source/drain region;
forming a gate;
forming a dielectric material that separates the gate from the channel;
forming an access line in the trench connected to the gate, wherein the access line includes:
a first titanium nitride (TiN) material formed in the trench, wherein the first TiN material is formed directly on the substrate material;
a metal material formed over the first TiN material; and
a second TiN material formed over the metal material, wherein a top surface of the first TiN material, a top surface of the metal material, and a top surface of the second TiN material are formed to a same height relative to sidewalls of the trench;
forming a sense line coupled to the first source/drain region; and
forming a storage node coupled to the second source/drain region.

* * * * *